May 12, 1970 E. D. ROSENTHAL 3,512,106

CLOCK OSCILLATOR

Filed March 8, 1968 3 Sheets-Sheet 1

*INVENTOR*
E. D. ROSENTHAL

Fetherstonhaugh & Co.
*ATTORNEYS*

May 12, 1970 E. D. ROSENTHAL 3,512,106

CLOCK OSCILLATOR

Filed March 8, 1968 3 Sheets-Sheet 2

INVENTOR
E. D. ROSENTHAL

Fetherstonhaugh & Co.
ATTORNEYS

May 12, 1970 E. D. ROSENTHAL 3,512,106

CLOCK OSCILLATOR

Filed March 8, 1968 3 Sheets-Sheet 3

INVENTOR
E. D. ROSENTHAL

Fetherstonhaugh & Co.
ATTORNEYS

3,512,106
CLOCK OSCILLATOR

Edward Daniel Rosenthal, Montreal, Quebec, Canada, assignor to Canadian Marconi Company, Montreal, Quebec, Canada Filed Mar. 8, 1968, Ser. No. 711,722
Claims priority, application Canada, Mar. 17, 1967, 985,547
Int. Cl. H03k 3/26, 5/23
U.S. Cl. 331—111 10 Claims

ABSTRACT OF THE DISCLOSURE

An oscillator circuit having a first feedback path comprising an inverter gate and a reactive element, and a second feedback path comprising an inverter gate and a resistive element, the input to the second feedback path being connected to the junction of the inverter and the reactive element of the first feedback path.

This invention relates to a novel oscillator circuit. More specifically, this invention relates to an oscillator circuit wherein inverting gates comprise at least a portion of the feedback paths.

Although not restricted thereto, the invention is particularly adaptable to serving as a clock oscillator in a computer system. Presently available clock oscillators normally do not provide a normalized logic level output. Therefore, it is necessary to provide a further amplifier stage, which is relatively costly and space consuming. In addition, the known clock oscillators are not compatible to microminiaturization using conventional components. Furthermore, the operational frequency of the prior art oscillators of the above mentioned class is not conveniently changeable.

It is, therefore, an object of the invention to provide an oscillator circuit having a normalized logic level output.

It is a further object of the invention to provide an oscillator circuit which is compatible to microminiaturization using conventional components.

It is a still further object of the invention to provide an oscillator circuit whose operational frequency is conveniently and easily changeable.

According to the invention, an oscillator circuit comprises, an active element having at least input and output electrode connections; a first feedback circuit between said output electrode connection and said input electrode connection; a second feedback circuit between a portion of said first feedback circuit and said input electrode connection; and output means connected to a portion of said second feedback circuit; characterized in that said first feedback circuit comprises a first inverter gate connected to said output electrode connection, and a reactive device, selected from the group consisting of capacitors, inductors and crystals, between the output terminal of said first inverter gate and said input electrode connection; and in that said second feedback circuit comprises a second inverter gate connected to the output terminal of said first inverter gate, and resistive means connected between the output terminal of said second inverter gate and said input electrode connection.

In a preferred embodiment of the invention said active element comprises a transistor having base, collector and emitter electrodes, and wherein said input electrode is the base electrode and said output electrode is the collector electrode. The inverter gates are preferably of the Diode Transistor Logic (DTL) or Diode Transistor Micro Logic (DTμL) types.

The output means may comprise a further inverter gate connected to the output terminal of said second inverter gate.

With the above described circuit, a normalized logic level output is immediately obtainable. The operating frequency is easily and conveniently changeable by the simple step of changing the value of the reactive device. As is well known to one skilled in the art, the frequency of the oscillator is determined by the time constant of the resistance-reactance network, or the frequency of the crystal, as modified by the characteristics of the inverting gates. The circuit configuration is easily adaptable to microminiaturization. Further advantages of the circuit are that it is relatively insensitive to changes in supply voltage and to changes in temperature.

Other objects and advantages will be apparent from or explicit in the following description when read in conjunction with the accompanying drawings in which.

Figure 1:
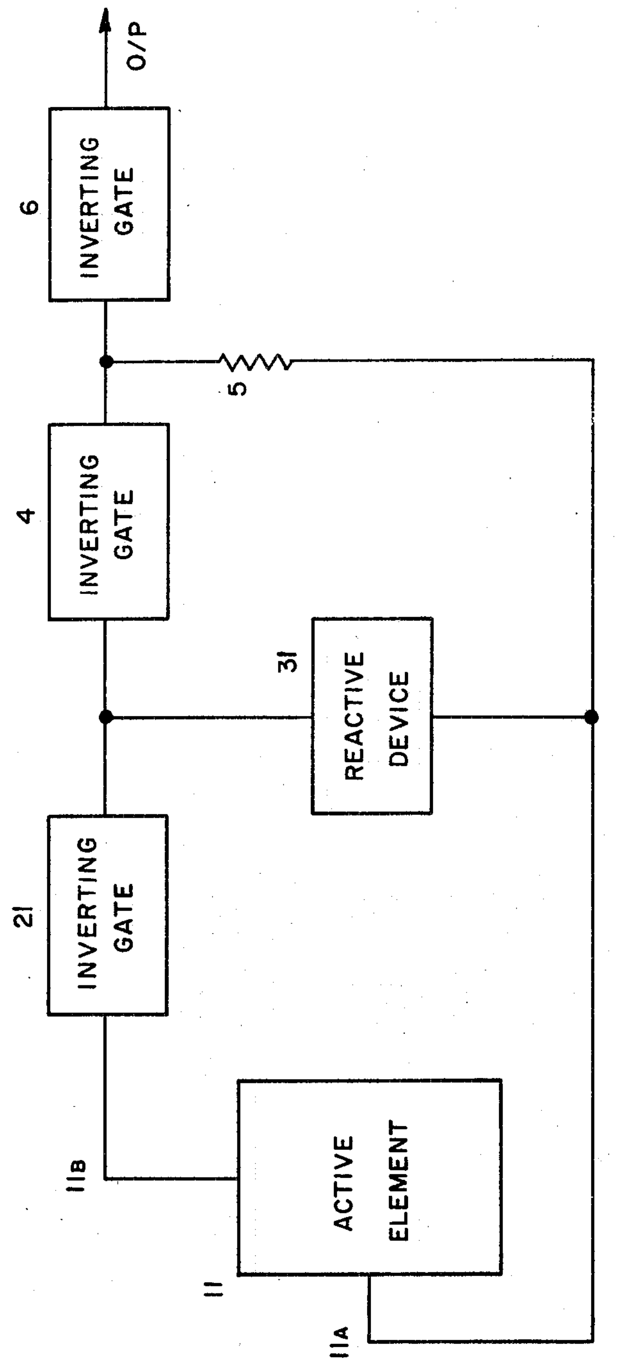
FIG. 1 is a generalized block diagram of the invention.

Referring now to FIG. 1, an active element 11, having input and output electrode connections 1*a* and 1*b*, is connected at its output connection to an inverter gate 21. The inverter gate may be any type of gate which inverts the input signal, i.e. provides an output signal which is 180° out of phase with the input signal, such as NAND or NOR gates. However, it is preferred to use DTL or DTμL gates. The output terminal of the inverting gate 21 is connected both to the input terminal of a further inverting gate 4 and to one terminal of a reactive device 31. The other terminal of the reactive device is connected to the input electrode connection of the active device. The output of the inverting gate 4 is connected to one terminal of a resistor means 5 whose other terminal is connected to the input electrode connection of the active element. A further inverting gate 6 may be included as a buffer means; however, gate 6 is not necessary for the operation of the oscillator. The reactive device 31 comprises either a capacitor, an inductor or a crystal.

Figure 2:
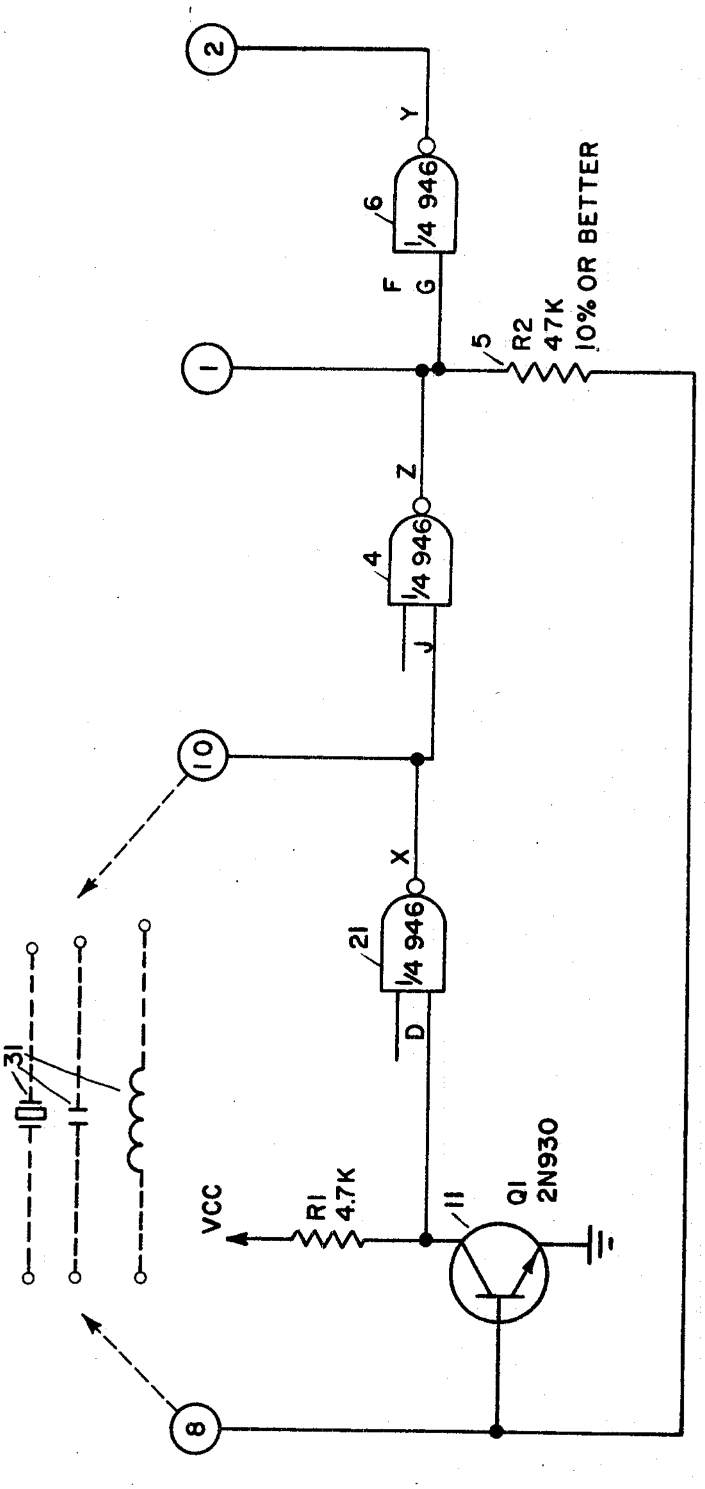
FIG. 2 illustrates a preferred embodiment of the invention.

The embodiment illustrated in FIG. 2, is a practical circuit built for test and evaluation purposes by the applicant. It comprises a DTμL 946 chip, having four gates, which supplies the inverting gates and buffer stage. The pin connections shown are those of the pins of the packaged oscillator. The active element comprises a transistor, for example the type designated 2N930. Gates 21, 4 and 6 each comprise ¼ of the 946 chip, and the resistor 5 is a 47K resistor. The reactive element 31 is connected between pins 8 and 10. The output can be taken from pin 1 or, if a buffer is required as noted above, from pin 2. The entire circuit is advantageously mounted as a microminiature module. The frequency of the oscillator is conveniently and easily changeable by the simple means of removing the reactive element and replacing it with an alternative element.

Figure 3:
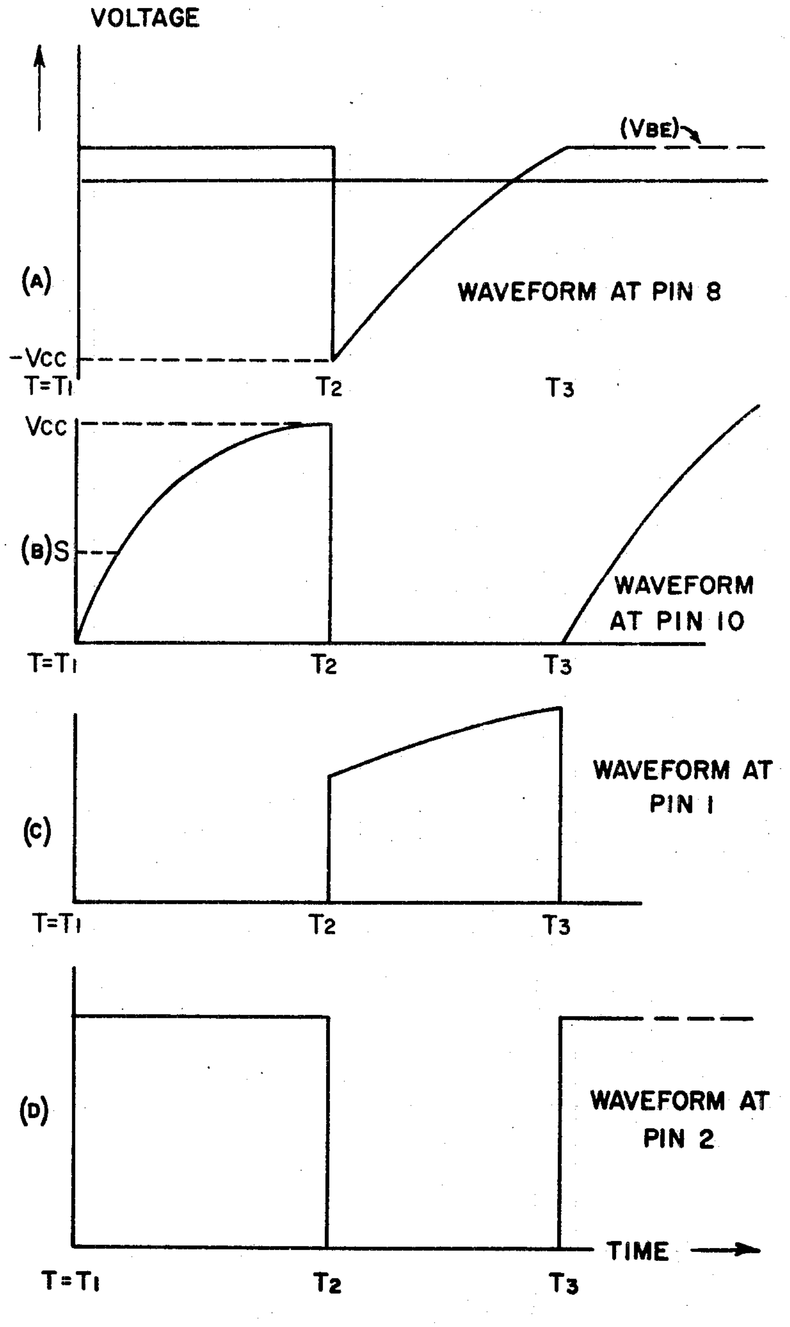
FIG. 3 shows the waveforms at different points in the FIG. 2 embodiment.

FIG. 3 shows the waveforms obtained at different points in the circuit of FIG. 2 for one cycle of operation. Assuming that the transistor 11 is in saturation at $t=t_1$, then the voltage at pin 8 is equal to $V_{be}$ of the transistor. At this time, the collector voltage will be substantially zero so that the output of gate 21 will tend to $V_{cc}$ by a flow of charge through the capacitor, as is shown in FIG. 3*b*. The rate at which the voltage at pin 10 increases to $V_{cc}$ is determined by the value of the capacitor as well as the characteristics of the gates in a manner that applicant is not at present able to explain in a quantitative manner. However, as is seen in FIG. 3*b*, the voltage increases at an almost linear rate up to point S whence it continues at an exponential rate. When the voltage at pin 10 reaches $V_{cc}$, at $t=t_2$, there will no longer be a flow of charge through the capacitor so that the base current reduces to zero and the transistor switches off. The collector voltage is now equal to $V_{cc}$ so that the output of gate 21 will drop to zero. The output of gate 4 now rises to approximately $V_{cc}$. At the same time, the voltage at the bottom of the capacitor drops to $-V_{cc}$. Capacitor 31 now begins to discharge through resistor 5 at a rate primarily determined by the values of the capacitor and the resistor until, at $t=t_3$ the voltage at the base of the transistor is again equal to $V_{be}$, whereupon the transistor switches on and the collector voltage goes to zero, and the output of gate 21 tends to $V_{cc}$ starting the chain of events which initiates a new cycle.

Although a specific embodiment has been described in the foregoing, it is understood that this was included for the purpose of illustrating, but not limiting the invention. Various modifications which will come readily to the mind of one skilled in the art, are within the scope of the invention.

I claim:

1. An oscillator circuit comprising an active element having at least input and output electrode connections; a first feedback circuit between said output electrode connection and said input electrode connection; a second feedback circuit between a portion of said first feedback circuit and said input electrode connection; and output means connected to a portion of second feedback circuit; characterized in that said first feedback circuit comprises a first inverter gate connected to said output electrode connection, and a reactive device, selected from the group consisting of capacitors, inductors and crystals, between the output terminal of said first inverter gate and said input electrode connection; and in that said second feedback circuit comprises a second inverter gate connected to the output terminal of said first inverter gate, and resistive means connected between the output terminal of said second inverter gate and said input electrode connection.

2. An oscillator circuit as defined in claim 1 wherein said active element comprises a transistor having base, collector and emitter electrodes, and wherein said input electrode is the base electrode and said output electrode is the collector electrode.

3. An oscillator circuit as defined in claim 2 wherein said inverter gates are Diode Transistor Logic (DTL) gates.

4. An oscillator circuit as defined in claim 2 wherein said inverter gates are Diode Transistor Micro Logic (DT$\mu$L) gates.

5. An oscillator circuit as defined in claim 3 wherein said reactive device is a capacitor.

6. An oscillator circuit as defined in claim 3 wherein said reactive device is a crystal.

7. An oscillator circuit as defined in claim 4 wherein said reactive device is a capacitor.

8. An oscillator circuit as defined in claim 4 wherein said reactive device is a crystal.

9. An oscillator circuit as defined in claim 7 wherein said output means comprises a further DT$\mu$L gate connected to the output terminal of said second DT$\mu$L gate.

10. An oscillator circuit as defined in claim 8 wherein said output means comprises a further DT$\mu$L gate connected to the output terminal of said second DT$\mu$L gate.

No references cited.

JOHN KOMINSKI, Primary Examiner

U.S. Cl. X.R.

331—116; 307—214